United States Patent
Blondin et al.

(10) Patent No.: US 6,176,374 B1
(45) Date of Patent: *Jan. 23, 2001

(54) COMPONENT CARRIER HAVING A WAVE PATTERN TENSION REDUCTION SURFACE

(75) Inventors: John Michael Blondin, Colchester; Jeffrey Jay Jones, Essex Junction; David J. Rich, Essex Junction; Woody Ray Smith, Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/778,128

(22) Filed: Jan. 2, 1997

(51) Int. Cl.⁷ .................................................. B65D 85/00
(52) U.S. Cl. .......................... 206/722; 206/503; 206/564
(58) Field of Search ................................... 206/722, 723, 206/725, 701, 591, 593, 594, 583, 521, 523, 503, 508, 561, 564

(56) References Cited

U.S. PATENT DOCUMENTS

| | | | |
|---|---|---|---|
| 1,568,834 | * 1/1926 | Hauge et al. | 206/594 |
| 1,892,527 | * 12/1932 | Gray | 206/503 |
| 2,744,624 | * 5/1956 | Hoogstoel et al. | 206/65 |
| 3,231,074 | * 1/1966 | Block | 206/503 |
| 3,272,371 | * 9/1966 | Weiner | 206/503 |
| 4,210,244 | * 7/1980 | Westrick | 206/373 |
| 4,681,225 | * 7/1987 | Schuster | 206/426 |
| 5,031,769 | * 7/1991 | Shea et al. | 206/335 |
| 5,096,527 | 3/1992 | Biagiotti . | |
| 5,169,583 | 12/1992 | Moriguchi et al. . | |
| 5,215,804 | 6/1993 | Hagens et al. . | |
| 5,368,789 | 11/1994 | Kamitakahara et al. . | |
| 5,451,722 | 9/1995 | Gregoire . | |

* cited by examiner

Primary Examiner—Paul T. Sewell
Assistant Examiner—Nhan T. Lam
(74) Attorney, Agent, or Firm—James M. Leas

(57) ABSTRACT

A container system for storing and transporting sensitive components such as semiconductor chips is disclosed. The container system includes in combination, a housing and a plurality of component carriers for receiving components to be stored and transported in stacked banks. The plurality of component carriers are stacked one on top of the other in a top-to-bottom stacked arrangement within the housing. An underside bottom surface of a first component carrier provides a top cover to a second component carrier positioned immediately below the first component carrier, wherein a component carrier includes a compartmental core for storing components on a top surface thereof in segmented row compartments, each segmented row compartment having sidewall surfaces and a bottom surface. The component carrier further includes an underside surface characterized by unidirectional waves having a prescribed wave amplitude and a prescribed wave period, the wave amplitude and wave period selected for simultaneously providing a reduced surface tension to a top surface of a component part and a reduced potential for damage to protruding surface features on a top surface of the component part, respectively, the component part further for being stored in a row compartment of an underlying component carrier in the stacked arrangement.

16 Claims, 5 Drawing Sheets

FIG. 4A - PRIOR ART
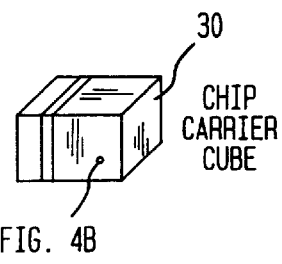
FIG. 4B - PRIOR ART
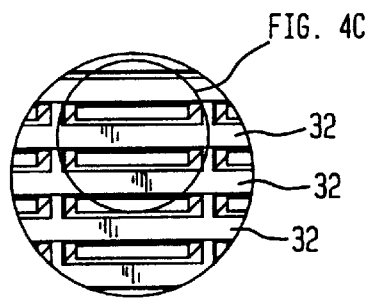
FIG. 4C - PRIOR ART
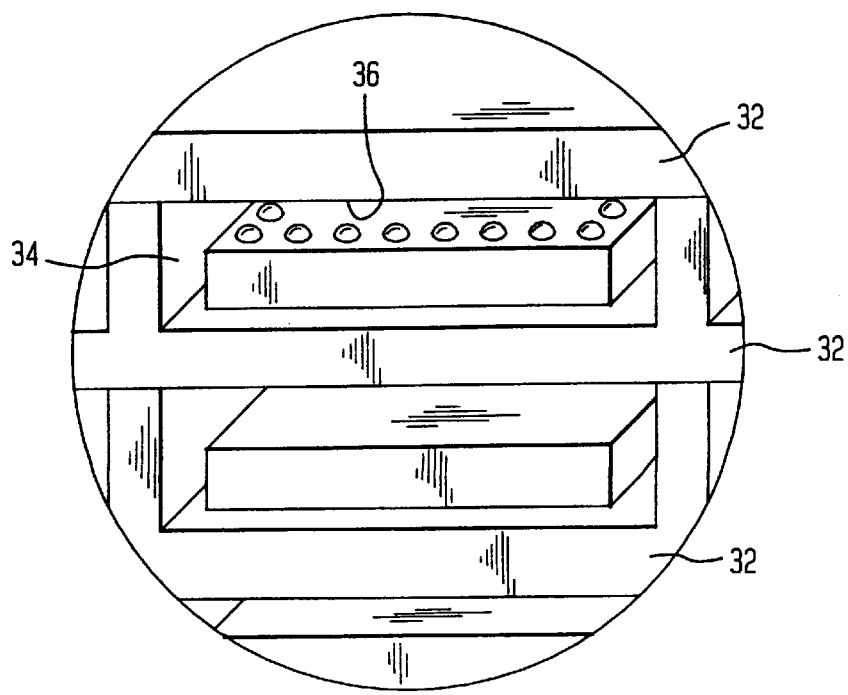

FIG. 5A - PRIOR ART
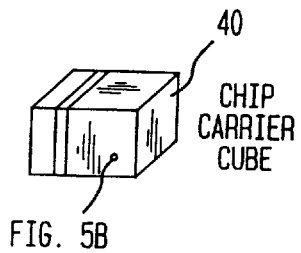
FIG. 5B - PRIOR ART
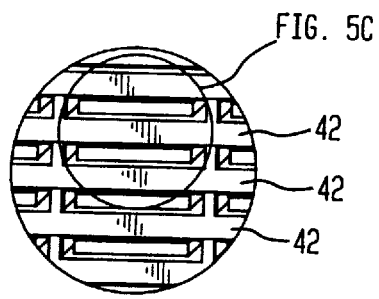
FIG. 5C - PRIOR ART
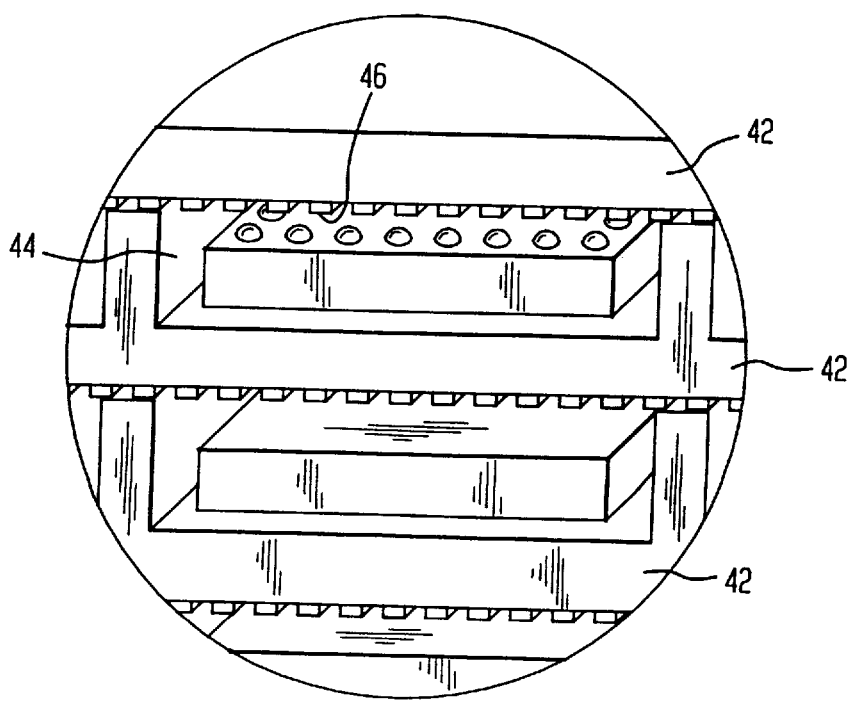

COMPONENT CARRIER HAVING A WAVE PATTERN TENSION REDUCTION SURFACE

BACKGROUND OF THE INVENTION

1. Field of the Invention

This invention relates generally to a container system for storing and transporting of sensitive components such as semiconductor chips, and, more particularly, to a component carrier that provides an improved physically protective environment for the components during storage and shipping.

2. Discussion of the Related Art

Semiconductor devices typically comprise one or more semiconductor chips designed for performing a desired function. The manufacture of semiconductor devices begins with the manufacture of the semiconductor chips. The semiconductor chips are first produced in a wafer form and subsequently diced from the wafer into individual chips. The individual chips are then packaged on a suitable substrate. During the device manufacturing process, the semiconductor chips are usually stored temporarily in a chip carrier and transported from one processing station to the next with the chip carrier. At the time the semiconductor chips are stored and transported, the semiconductor chips may include, on a top surface thereof, die having wire bond pads or solder balls suitable for Controlled Collapsed Chip Connector (C4). The semiconductor chips are hereinafter referred to as wire bond die product and bumped die product, respectively.

Referring to FIG. 1, a semiconductor component 10 includes a semiconductor chip 12 mounted upon a substrate or package 14 as shown. The example shown is a bumped die product 12 connected to a substrate or package 14 having input/output pins 16 for connection with a next level of packaging, such as a printed circuit board (not shown). For connecting the chip 12 to the substrate 14, the semiconductor chip 12 is appropriately placed upon the substrate 14 and then together, the chip and substrate are subjected to a reflow process. FIG. 2 exemplifies a cross sectional view of the semiconductor chip properly joined to the underlying substrate via solder ball connection after a solder reflow process. In the properly joined chip and substrate of FIG. 2, electrical connections are made in the form of solder columns 18. In contrast, FIG. 3 exemplifies a cross sectional view of the semiconductor chip improperly joined to the underlying substrate. The electrical connections of the chip 12 to substrate 14 of FIG. 3 are not all properly made. For instance, numeral 20 identifies a nonwet or poor solder joint, which is susceptible to failure subsequent to completion of the device manufacturing process, and further corresponds to a high reliability exposure. In addition, numeral 22 identifies an open solder connection resulting from a low volume C4 solder ball pad, further corresponding to a yield exposure. The low volume C4 solder ball pad may have been caused as a result of a good solder ball having been damaged during a previous handling, storage, and/or transportation of the semiconductor die during the manufacturing process.

In the semiconductor device manufacturing process, chip container systems are used, such as are known in the art. A first example of a known chip container system 30 including chip carriers 32 is shown in FIGS. 4A–4C. In short, semiconductor die product are placed upon individual chip carriers 32, in appropriate pockets or segmented rows 34, and a plurality of chip carriers 32 loaded with chips are stacked one upon another in a stacked arrangement. The semiconductor die product or chip typically has a thickness on the order of two-thirds (⅔) of the total pocket depth. Chip carriers are stacked by process requirement. The underside bottom surface 36 of one chip carrier is used to cover a top of an underlying adjacent chip carrier. In the chip container system 30 of FIGS. 4A–4C, the underlying bottom surface 36 of a chip carrier 32 includes a fine textured flat surface or similar sand blast type finish. Such a fine textured flat surface is used on the covering surface for both wire bond and bumped die product for preventing the die product from sticking thereto. Unfortunately, the textured flat surface becomes smoothed out, by repeated uses and cleaning, over a period of time. A smoothed out covering surface is undesirable and problematic, since a wire bond die product is subject to sticking thereto due to surface tension. In a second container system design 40 having chip carriers 42 as shown in FIGS. 5A–5C, a cross grid finish has been used on a bottom surface 46 of a chip carrier. The cross grid finish is undesirable and problematic in the case of bumped die product, since bumped die product are highly subject to damage thereby. Both wire bond and bumped die product should stick to a bottom surface of the chip carrier in the appropriate pocket or segmented row (34 of FIG. 4C, 44 of FIG. 5C) during a carrier shipment to reduce chip movement within the carrier, further for reducing damage to the die product edges. However, while both wire bond and bumped die product should stick to the bottom surface of the appropriate pocket or segmented row of the chip carrier during a carrier shipment, die product sticking to an underside of an adjacent chip carrier causes lost chips and/or damage in follow-on processing and follow-on process tooling. Again, the fine textured flat surface is undesirable since it possesses an early wear/failure rate due to repeated use and cleaning, thereby causing a relapse of the underside surface tension problem.

It would thus be desirable to eliminate undesired die product sticking, surface tension, adhesion problems to an underside of an adjacent chip carrier of a stack of chip carriers for wire bond die products and simultaneously reduce damaging bumped die products caused by an underside of the adjacent chip carrier of a stack of chip carriers.

SUMMARY OF THE INVENTION

It is an object of the present invention to provide a container system for the storage and transport of component parts, such as semiconductor wire bond and bumped die chip products, with an aim to overcome the aforementioned problems and disadvantages.

In accordance with the present invention, a container system includes, in combination, a housing and a plurality of component carriers for receiving components to be stored and transported in stacked banks. The plurality of component carriers are stacked one on top of the other in a top-to-bottom stacked arrangement within the housing. In the stacked arrangement, an underside bottom surface of a first component carrier provides a top cover to a second component carrier positioned immediately below the first component carrier. Each component carrier includes a compartmental core for storing components on a top surface thereof in segmented row compartments. Each segmented row compartment includes sidewall surfaces and a bottom surface. The component carrier further includes an underside surface characterized by unidirectional waves having a prescribed wave amplitude and a prescribed wave period. The wave amplitude and wave period are selected for simultaneously providing (i) a reduced surface tension to a top surface of a component part and (ii) a reduced potential for damage to protruding surface features on a top surface of the component part, respectively, wherein the component part is stored in a row compartment of the underlying component carrier of the stacked arrangement.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which:

FIGS. 4A–4C shows a first example of a known container system;

FIGS. 5A–5C shows a second example of a known container system;

DETAILED DESCRIPTION OF A PREFERRED EMBODIMENT OF THE INVENTION

Figure 1:
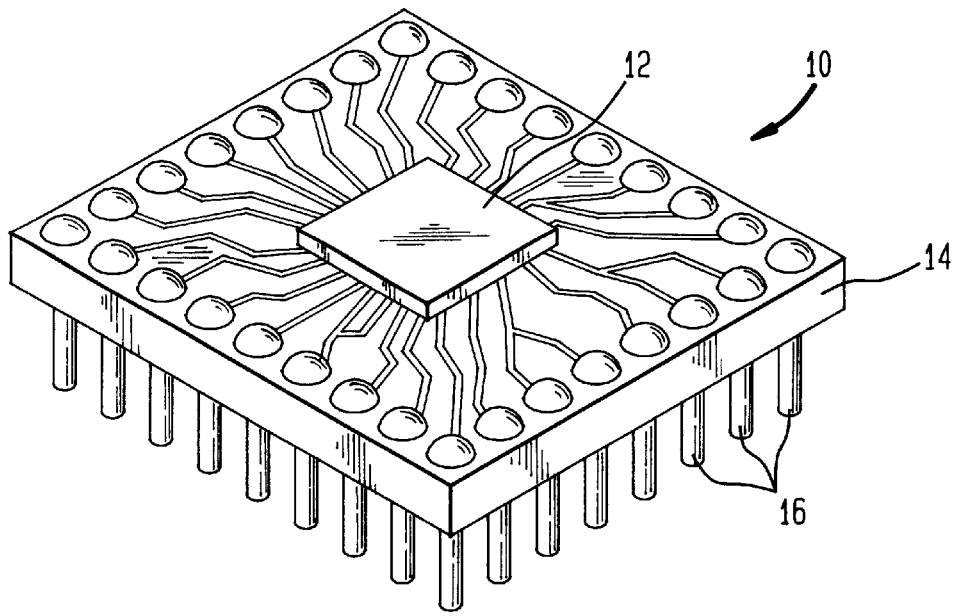
FIG. 1 shows an example of a semiconductor device having a semiconductor chip connected via solder ball connection to a single-chip module substrate.
Figure 2:
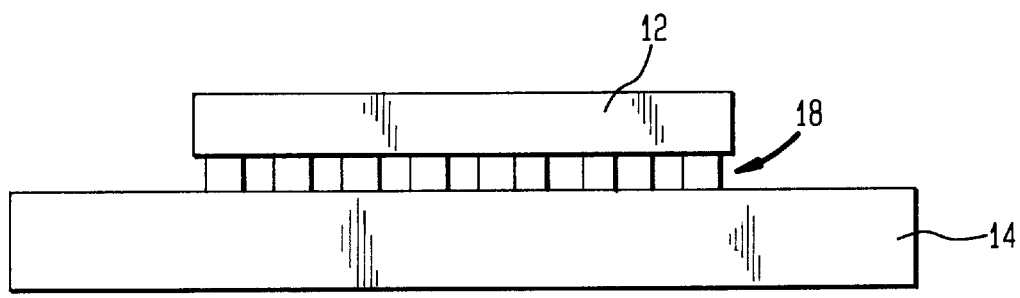
FIG. 2 shows a side cross-section view of a properly joined C4 solder ball connection between a semiconductor chip an substrate after a reflow process.
Figure 3:
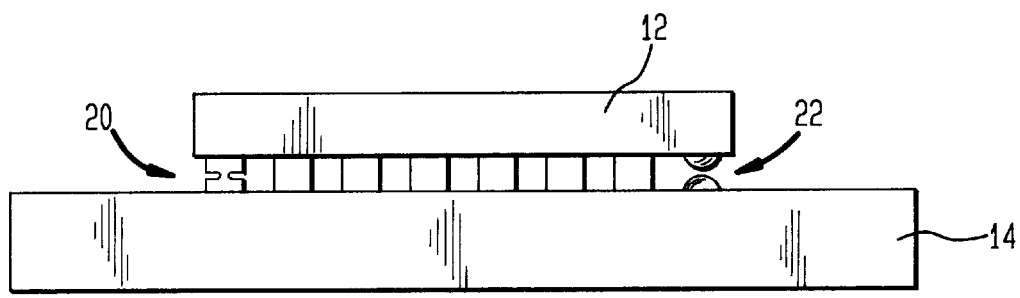
FIG. 3 shows a side cross-section view of an improperly joined C4 solder ball connection between a semiconductor chip an substrate after a reflow process.
Figure 6A:
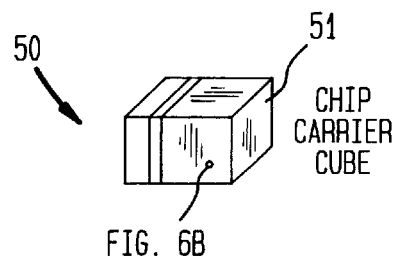
FIGS. 6A–6C shows a container system in accordance with the present invention.
Figure 6B:
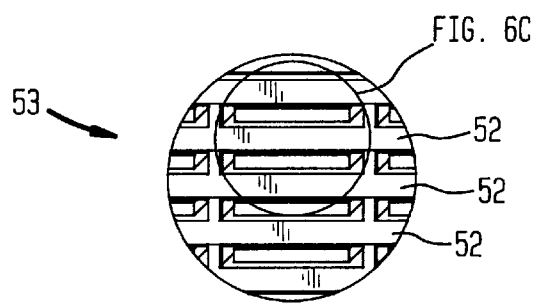
Figure 6C:
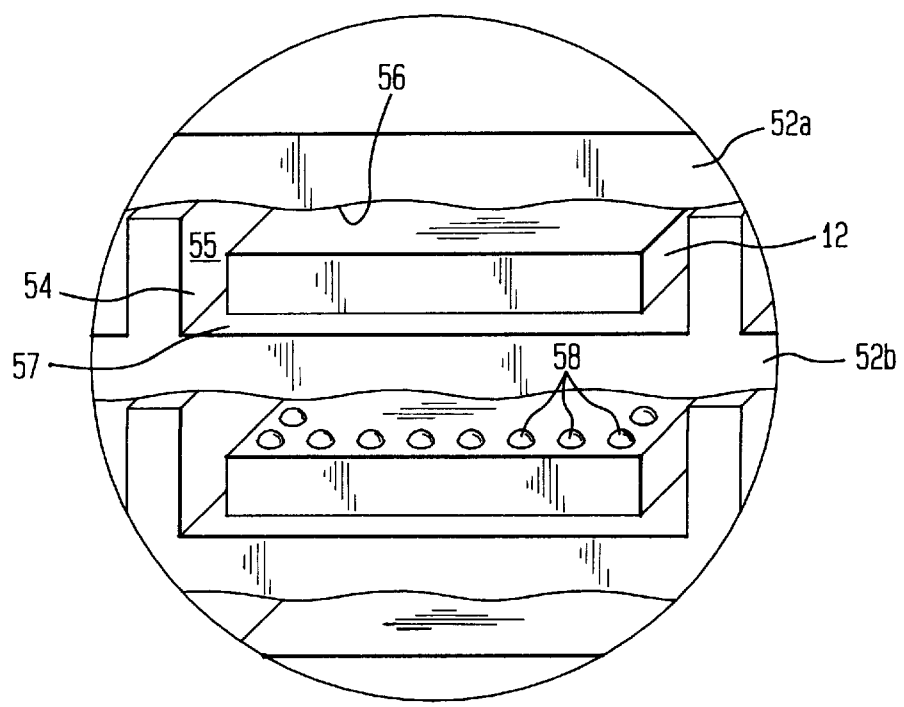

Turning now to FIGS. 6A–6C, a container system 50 for storing and transporting sensitive components, such as semiconductor chips 12, shall be described. Container system 50 includes, in combination, a housing 51 and a plurality of component carriers 52. The component carriers 52 are provided for receiving components 12 to be stored and transported in stacked banks 53. The plurality of component carriers 52 are stacked one on top of the other in a top-to-bottom stacked arrangement within the housing 51. An underside bottom surface 56 of a first component carrier 52a provides a top cover to a second component carrier 5b positioned immediately below the first component carrier 52a.

Each component carrier 52 includes a compartmental core for storing components 12 on a top surface thereof in pockets or segmented row compartments 54. The compartmental core can include, for example, polycarbonate, polypropylene, polystyrene, or any other suitable stable material. Each pocket or segmented row compartment 54 includes sidewall surfaces 55 and a bottom surface 57. Bottom surface 57 can include a smooth bottom surface, for instance, having a standard electrical discharge machining (EDM) finish.

Figure 7:
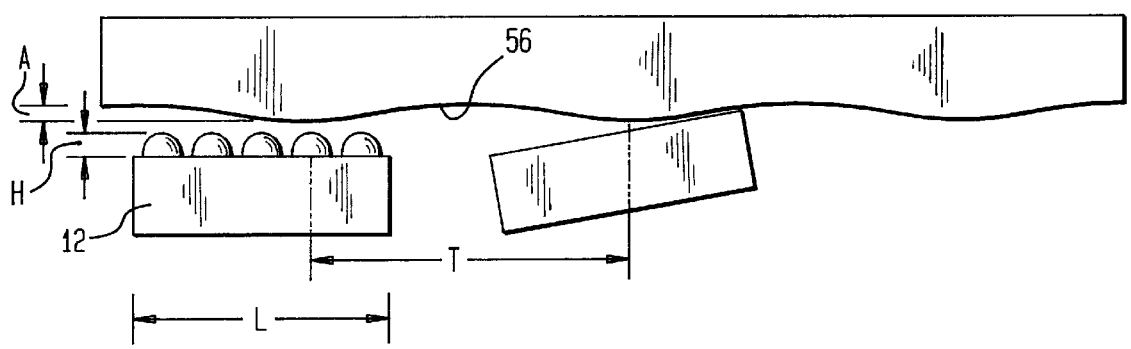
FIG. 7 illustrates a portion of the container system of FIG. 6C in further detail.

Referring now to FIGS. 6A–6C and 7, the component carrier 52a includes an underside surface 56 characterized by unidirectional waves having a prescribed wave amplitude A and a prescribed wave period T. The wave amplitude A and wave period T are selected for simultaneously providing a reduced surface tension to a top surface of a component part 12 and a reduced potential for damage to protruding surface features 58 on a top surface of the component part, respectively. In the example presently being discussed, the component part 12 is stored in a row compartment 54 of an underlying component carrier 52b in the stacked arrangement 53 (FIG. 7).

Referring now to FIG. 7, the wave amplitude A of the unidirectional waves is selected to be on the order of 20–80% of a height dimension H of a tallest protruding surface feature of the protruding surface features 58 on the top surface of the component part 12. In a preferred embodiment, the wave amplitude of the unidirectional waves is on the order of 80% of the height dimension of the tallest protruding surface feature of the protruding surface features on the top surface of the component part.

The wave period T of the unidirectional waves is selected to be on the order of 20–80% over a length dimension L of a smallest component part anticipated to be stored in the container system 50. For instance, if the smallest semiconductor die has a length dimension of 0.070 inches, then an acceptable wave period would be in the range of 0.084" (i.e., 0.070"+0.014") to 0.126" (i.e., 0.070"+0.056"). In a preferred embodiment, the wave period of the unidirectional waves is on the order of 40–50% over the length dimension of the smallest component part anticipated to be stored in said container system.

In one embodiment, the container system 50 is preferably designed for storing and transporting semiconductor chips 12 having protruding surface features corresponding to controlled collapsed chip connector (C4) solder balls. Standard Pb/Sn C4 solder balls or bumps are on the order of 0.003" to 0.006", typically. The wave amplitude of the unidirectional waves is thus selected to be on the order of 0.003"+/−0.001" for minimal distortion, corresponding to 0.002" to 0.004". Preferably, the wave amplitude of the unidirectional waves is on the order of 0.003 inches. In this latter instance, the wave period of the unidirectional waves is selected to be on the order of 0.100" peak-to-peak.

Alternatively, the container system 50 according to the present invention is likewise designed for storing and transporting semiconductor chips having protruding surface features corresponding to wirebond pads.

While the container system according to the invention has been shown and described as being used in conjunction with semiconductor chips, the container system may equally be implemented for use with other component parts. In addition, while the invention has been shown and described as using waffle pack chip carriers, it is to be understood that such chip carriers can equally be carried out as tape and reel chip carriers.

There has thus been shown a container system which provides for storing and transporting of sensitive components. Such a container system eliminates undesired component part damage, surface tension, and adhesion problems.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, a component carrier in accordance with the present invention may be adapted for packaging of passive components (e.g., capacitors or other components) when surface tension and damage protection need to be addressed by one solution. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A component carrier comprising:
   a first inner surface and a second inner surface, said second inner surface facing said first inner surface, a space there between, said first inner surface including a smoothly curving wave pattern including raised areas, said raised areas having no adhesive, said second inner surface being flat; and,
   an electronic component comprising an integrated circuit chip in said space between said first inner surface and said second inner surface.

2. The carrier as recited in claim 1, wherein said first surface is part of a cover and said second surface is for supporting the component.

3. The carrier as recited in claim 2, wherein said first surface is a bottom surface of said cover, said cover further comprising a top surface, said top surface for supporting another component.

4. The carrier as recited in claim 2, further comprising a plurality of said component carriers said plurality of component carriers stacked one on top of the other, the component carriers each comprising a bottom surface having a smoothly curving wave pattern including raised areas and a top surface that is flat, so that when stacked a smoothly curving surface faces a flat surface.

5. The container as recited in claim 4, further comprising a housing for containing said plurality of component carriers.

6. The carrier as recited in claim 2, wherein said second surface is flat and smooth so that said component sticks to said second surface as a result of a great area of contact there between.

7. The carrier as recited in claim 6, wherein the chip has solder bumps.

8. The container as recited in claim 7, wherein said the solder bumps have a height dimension, said wave pattern having a wave amplitude, wherein said wave amplitude is 20–80% of said height dimension.

9. The carrier as recited in claim 6, wherein the chip has pads for wire bond connection.

10. The container as recited in claim 9, said chip having a length dimension, said wave pattern having a wave period, wherein said wave period being at least 20–80% over said length dimension.

11. The container as recited in claim 10, wherein said wave period is at least 40–50% over said length dimension.

12. The container as recited in claim 1, the wave extending along one direction.

13. The carrier as recited in claim 1, wherein said wave pattern has a wave amplitude and a wave period, wherein said wave amplitude is about 0.002 to 0.004 inches.

14. The container as recited in claim 13, wherein said wave amplitude is about 0.003 inches.

15. The carrier as recited in claim 13, wherein said wave period of the wave is about 0.1 inches peak-to-peak.

16. A carrier as recited in claim 1, wherein said component does not stick to said first surface.

\* \* \* \* \*